United States Patent [19]

Li

[11] Patent Number: 5,602,421
[45] Date of Patent: Feb. 11, 1997

[54] MICROWAVE MONOLITHIC INTEGRATED CIRCUIT PACKAGE WITH IMPROVED RF PORTS

[75] Inventor: Kuo-Hsin Li, Irvine, Calif.

[73] Assignee: Hughes Aircraft Company, Los Angeles, Calif.

[21] Appl. No.: 381,379

[22] Filed: Jan. 31, 1995

[51] Int. Cl.$^6$ .......................... H01L 29/40; H01L 23/34; H01L 23/04
[52] U.S. Cl. ............................. 257/728; 257/664; 257/730
[58] Field of Search .................................. 257/728, 730, 257/664, 729

[56] References Cited

U.S. PATENT DOCUMENTS

| | | | |
|---|---|---|---|
| 4,783,697 | 11/1988 | Benenati et al. | 257/728 |
| 5,117,068 | 5/1992 | Seieroe et al. | 257/728 |
| 5,465,008 | 11/1995 | Goetz et al. | 257/728 |

FOREIGN PATENT DOCUMENTS 0444820  9/1991  European Pat. Off. ............... 257/728

*Primary Examiner*—Mahshid D. Saadat
*Assistant Examiner*—Valencia Martin Wallace
*Attorney, Agent, or Firm*—M. E. Lachman; M. W. Sales; W. K. Denson-Low

[57] ABSTRACT

A mounting and protective package for a monolithic microwave integrated circuit die (16) operable in the $K_a$-band is formed of two high temperature co-fired ceramic layers sandwiched by two metal layers (10,12,20,26) that minimize hermetic sealing problems. The package has high frequency input/output lines (40,42), each including a section defining a microstrip line (40a,41a), a section defining a shielded strip line (40b,41b), and a section defining a capacitor (40c, 41c). The capacitor is precisely defined to provide optimum input/output transmission line impedance that minimizes loss. The integrated circuit die (16) is mounted within a recess (14,46) in the package and is wire bonded (22,24) to input and output capacitors (40c,41c) that in turn are connected with shielded strip lines (40b,41b) and microstrip lines (40a,41a) for both input and output. An unique configuration and location of conductive material filled vias (48a–48l, 63a–63l) interconnect a metallized base and a metallized lid of the package to define a resonant cavity that eliminate resonant or moding problems from 26–36 GHz operation.

19 Claims, 2 Drawing Sheets

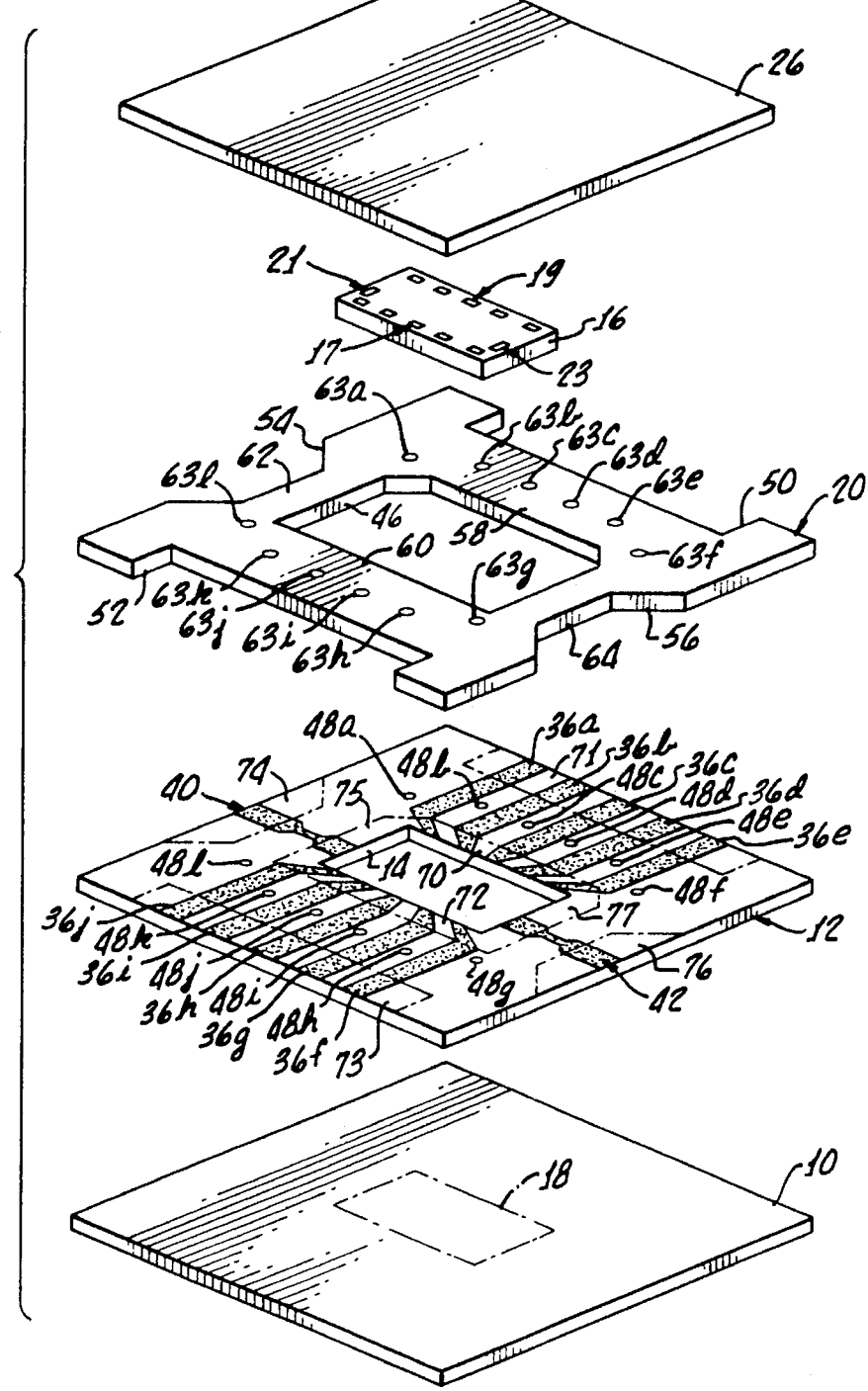

MICROWAVE MONOLITHIC INTEGRATED CIRCUIT PACKAGE WITH IMPROVED RF PORTS

This invention was made with Government support under Contract No. NAS 3-25864 awarded by the National Aeronautics and Space Administration. The Government has certain rights in this invention.

BACKGROUND OF THE INVENTION

1. Field of the Invention

The present invention relates to packaging of microwave monolithic integrated circuits and more particularly concerns a package that provides low insertion loss and mode free operation at $K_a$-band frequencies.

2. Description of Related Art

For handling and protection, monolithic microwave integrated circuits (MMIC's), like many other types of integrated circuit dies, are mounted in protective packages that provide shielding and protection for the die during handling and operation. Prior art protective packages include a quartz package and multi-chip MMIC (monolithic microwave integrated circuit) module package.

The quartz packages use fused quartz for the construction of quartz wall and quartz substrate which are the main body of the dielectric layers for the RF transmission lines. The metal conductors are formed on the surface of the quartz substrate through thin film or thick film processing before the quartz wall and the quartz substrate are fired together with glass seal material. The transmission line design of the RF port for the quartz package is based on two sections of microstrip line outside the quartz wall and a strip line section within the wall. The fused quartz material selected for the dielectric layers of the package is good for the RF transmission lines due to the low dielectric constant and the low loss tangent of the quartz material. Unfortunately, with the metal conductors between the quartz wall and the quartz substrate, the quartz seal material for sealing these two layers together do not meet military specifications, such as the MIL-Std-883 seal test requirements. Insertion loss of engineering quartz packages have been tested to be as low as 0.4 dB at 35 GHz from each port (1.24 dB for the two ports), in a model having an integrated microstrip line connecting the two RF input/output ports. This means the testing has not taken into consideration the effect of any wire bonding. Subsequent engineering runs using both discrete microstrip line and wire bonding for connecting the two RF ports have, on the other hand, shown more than 2 dB insertion loss for the two ports.

Analysis of this inconsistent performance has uncovered two major causes of the inconsistency: (1) failure of the glass seal not only causes the package to fail to meet seal test requirements, but also forms inconsistent transmission lines, and (2) wire bonds connecting the package and the discrete microstrip line cause substantial insertion loss. Since both the microstrip line on the RF port of the package and the discrete microstrip line are 50 ohm transmission lines separated by air, the wire bond for connection produces enough inductance to induce significant insertion loss at $K_a$-band operation. The multi-chip MMIC module package of the prior art was designed to operate at up to 30 GHz. This package was formed of a multi-layer (5 layers) ceramic frame whose layers are metallized over most of both surfaces and co-fired. Additional metallization of the inner wall and outer wall are needed to form an electrical cavity for this kind of ceramic package. The transmission line design of the multi-chip MMIC module package for the RF port is based on microstrip lines outside the wall and a through-wall strip line within the shielded wall. The insertion loss for each of these ports is less than 0.5 dB at 30 GHz. At 35 GHz, the total insertion loss for the two RF ports is expected to exceed 2 dB. Both the above mentioned quartz package and the multi-chip ceramic package have a specific unique configuration to serve a certain purpose. Yet, none of these packages is useful at 35 GHz and beyond. In addition, due to the complexity of the prior art, low cost and commercialization are not easy to achieve.

Accordingly, it is an object of the present invention to provide a $K_a$-band MMIC package that avoids or minimizes above-mentioned problems.

SUMMARY OF THE INVENTION

In carrying out principles of the present invention, according to a preferred embodiment thereof, an integrated circuit chip $K_a$-band package is formed of a dielectric substrate having an opening therein, a dielectric wall co-fired to the substrate, a metal base brazed to the bottom side of the substrate, and a separate package lid for capping the package after the chip is mounted and the wire bond connected, forming an enclosed cavity. All the metal conductors and metal filled vias needed to form the package wall, the DC bias ports and RF transmission lines are co-fired together with the dielectric layers.

According to a feature of the invention, the transmission line design includes a microstrip line for connection of the RF transmission line to external circuitry, a shielded strip line within the wall structure, and a capacitor outside the wall and adjacent the chip mount recess. This integrated capacitor, substituting for a conventional microstrip line of prior art, provides the needed capacitance to compensate for inductance induced by the wire bond connection of the chip, thereby forming a corrected 50 ohm transmission line and reducing insertion loss. The RF input/output ports, each including a microstrip line, a shielded strip line within the improved package wall, and a capacitor, all integrated in each RF port, combine with a simplified and improved electrical cavity structure formed by two ground planes and an array of metal filled vias. This configuration contributes to a very low insertion loss (less than 1.3 dB for the two RF ports combined) and mode free operation at a wide range of $K_a$-band frequencies (from 26 to 36 GHz).

The package described herein is a cost effective, high performance package of a simple structure which can be easily reproduced using high temperature or low temperature co-fired ceramic fabrication procedure.

BRIEF DESCRIPTION OF THE DRAWINGS

In the accompanying drawings:

FIG. 1 is a sectional view of a die enclosed in a package embodying principles of the present invention;

FIG. 2 is an enlarged and exploded view of elements of the packaged die of FIG. 1;

DESCRIPTION OF THE PREFERRED EMBODIMENTS

Figure 3:
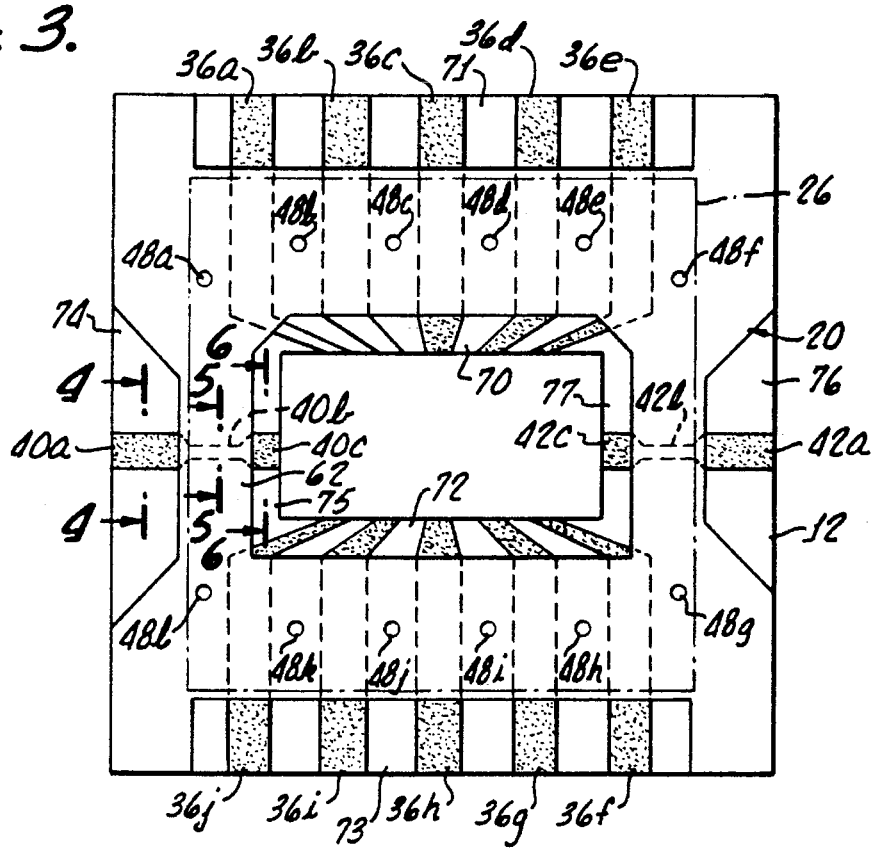
FIG. 3 is a plan view of the die package without the die and showing the lid in phantom line.

The package illustrated in cross section in FIG. 1, and in the exploded pictorial view in FIG. 2, includes a metal base 10, which is preferably formed of kovar or other equivalent metal such as copper tungsten composite, and to the upper surface of which is brazed the metallized lower surface of a dielectric substrate 12 formed of a suitable nonconductive material, such an aluminum oxide ($AL_2O_3$) ceramic having a dielectric constant of 9.5. The ceramic substrate 12 has an opening 14 formed in an interior portion thereof, and which receives an MMIC chip 16 resting on the upper surface of base 10 and secured thereto by an electrically conductive adhesive 18. Circuitry of the chip is operable in the $K_a$-band, in a range of frequencies between about 26 and 36 GHz. The chip has an electrically conductive underside that forms a ground plane for the chip circuitry. This ground plane is adhesively secured and electrically connected to the metal base 10 by the adhesive 18.

To extend the height of the recess 14, a layer that forms a wall structure 20 is co-fired to the upper side of the substrate. Wall structure 20 is also formed of a ceramic such as aluminum oxide having a dielectric constant of 9.5, and is metallized on its upper surface. A plurality of traces (see FIG. 2) are formed on the upper surface of substrate 12 and connected by wire bonds, such as wires 22,24 (FIG. 1), to connecting pads 17 and 19 (FIG. 2) on the upper surface of the chip. The sub-assembly of the chip within the recess of its several package layers (metal base, metallized substrate and metallized wall) is hermetically sealed by a lid 26 formed of a suitable metal, such as gold plated kovar, that is soldered to the metallized upper surface of the wall 20.

An array of vias 30,32 (and others not shown in FIG. 1) circumscribes the recess, in a pattern illustrated in FIGS. 2 and 3, and are filled and metallized with electrically conductive material. The vias form electrically conductive paths between the metal lid 26 and the metal base 10. Accordingly, the array of metallized vias, together with the lid and base, form an electrical cavity that further diminishes insertion losses in the $K_a$-band range of between 26 and 36 GHz, and eliminates moding problems.

Parts of the package assembly of FIG. 1 are illustrated, greatly enlarged, in the exploded view shown in FIG. 2. The metal or kovar base 10, having a dimension of 0.28×0.28 inches and a thickness of 0.010±0.001 inches in a specific embodiment, is brazed to the next layer, substrate 12. The substrate 12 is a ceramic substrate having the same dimensions as the base and, in a particular exemplary embodiment, a thickness of 0.015±0.001 inches. Formed on the upper surface of dielectric substrate 12 is a pattern of electrically conductive traces, including ten low frequency or DC traces 36a–36j and first and second oppositely disposed input/output traces 40,42.

When the substrate is assembled together with the base, wall and lid, traces 40,42 form parts of the high frequency input and output transmission lines. These include a microstrip line section 39a (FIG. 4) at an outermost section, a shielded strip line section 39b (FIG. 5) at an intermediate section, and a capacitor section 39c (FIG. 6) at an innermost section. The capacitor is connected to the wire bonds of the chip. The input/output transmission lines, their structure and operation will be discussed in detail below.

Substrate 12 is formed with a plurality of vias 48a through 48l (12 in all) which are filled with a conductive metallized material, such as tungsten or a mixture of high temperature metals which are then plated with nickel and gold.

Hole 14 and the vias of the substrate 12 are punched from the substrate at a green (unfired) stage. Hole 14 forms part of the recess in which the chip is physically located.

Co-fired to the upper surface of the substrate 12 is a second aluminum oxide ceramic layer forming the wall structure 20. Wall structure 20 also has an opening 46 which is larger than the opening 14 in substrate 12. Opening 46 circumscribes and is aligned with or symmetrically disposed about hole 14 in the substrate. Configuration and position of wall structure 20 and its opening relative to the substrate and the substrate opening are shown in dotted lines on the substrate 12 in FIG. 2 to better illustrate the relative size and location of the wall portions and the openings of the two layers. This relative positioning is also shown in FIG. 3. The wall structure 20 is formed with front and rear rectangular cutout portions 50,52 and left and right trapezoidal cutout portions 54,56. These several cutout portions, together with central opening 46, effectively form a wall front rail 58, a wall back rail 60, a wall left rail 62 and a wall right rail 64. Wall structure 20 also is formed with a plurality of electrically conductive vias 63a through 63l which are arranged in a pattern congruent with and aligned with the pattern of the substrate vias 48a–48l so as to provide straight conductive paths along each via from the conductive lid to the conductive base. These rails, openings and vias of the wall structure are also punched from the wall at a green stage.

Soldering of the gold plated kovar lid 26 to the wall 20 completes the assembly after the chip is inserted into the package recess, adhesively secured, and wire bonded to corresponding traces of the input/output transmission lines.

During manufacture of the package the traces on top of the substrate, the vias, the top surface of the wall and the bottom surface of the substrate are screen printed with tungsten before being simultaneously fired in the furnace. The traces formed thereon are indicated by numbers 36a–36j, 40 and 42. These traces are formed by a thin tungsten paste that is screen printed upon the substrate. After the screen printing of the traces, wall, and substrate, the wall structure 20 is positioned atop the substrate surface. The two ceramic layers (with the substrate traces at this stage of assembly defined only by the pattern of tungsten paste) are then pressed together and fired at a temperature in the order of 1,500° to 1,600° C., thereby bonding the two ceramic layers to one another and vaporizing the organic binder material that binds the aluminum oxide and the tungsten paste. In this process tungsten traces are bonded to and between the ceramic substrate and the ceramic wall. Although temperatures of 1500° to 1600° C. are used in a presently preferred embodiment, the invention can be implemented employing either high or low temperature fired materials and processes.

As can be seen in FIGS. 2 and 3, the wall structure covers only intermediate sections of the several traces formed on the substrate. Each of these traces, after heat bonding of the wall structure to the substrate, has exposed inner and outer portions on either side of the front, back, left and side rails of the wall. These exposed trace portions are then further metallized by being coated with nickel and then gold. Accordingly, the trace sections on either side of the four wall rails are composed of successive layers of tungsten, nickel and gold, whereas intermediate trace sections directly between the wall and substrate (e.g., directly under the wall rails) are composed only of tungsten. These covered intermediate tungsten sections are not exposed and need no protective nickel and gold coating.

The laminated wall structure and substrate are then placed on the base, and the substrate is brazed to the base. When the chip is ready for mounting in the package, the chip is located within the recess that is formed by the aligned, relatively symmetrically disposed openings in the substrate and wall structure. The opening in the wall structure is significantly larger than the opening 14 in the substrate, so as to provide the exposed trace sections on the inner side of the wall rail, for wire bonding to the chip pads. The chip connecting pads are wire bonded to respective ones of the traces 36a–36j, 40 and 42.

As can be seen in FIG. 3, wall structure 20 has exterior dimensions congruent with the exterior dimensions of the substrate 12 and base 10. The wall structure 20 is positioned relative to the base so that the front and back cutout portions 50,52 of the wall (FIG. 1) leave unexposed substrate areas having inner portions 70 (FIG. 2) that are outside of the substrate recess 14 but inside of the wall recess 46, and having outer portions 71 at the front of the substrate that are outside of front rail 58. Similarly, the back rail 60 of the wall structure leaves exposed substrate areas 72,73 on either side of the back rail. The left and right side trapezoidal wall cutouts 54,56 leave uncovered left and right lateral substrate outer areas 74,76 and uncovered left and right lateral substrate inner areas 75,77. These provide the uncovered outer trace sections 40a,42a and uncovered inner trace sections 40c,42c (FIG. 3) of the input/output transmission lines, which are generally indicated collectively (as above stated) at 40 and 42 in FIG. 2. Accordingly, after the wall structure is laminated and bonded to the substrate, the exposed sections of the several traces 36a through 36j and the input/output traces are further coated with nickel and gold, as previously described.

As can be seen in FIGS. 2 and 3, various ones of vias 48a–48l and 63a–63l are positioned between the traces 36a through 36e on the front side and between corresponding traces on the back side of the wall and substrate. Four of the vias (at the via array corners), 48a, 48f, 48g and 48l in the substrate and 63a, 63f, 63g and 63l in the wall structure are positioned inwardly of the laterally aligned front vias 48b–48e, 63b–63e, and the corresponding laterally aligned row of back vias 48h–48k, 63h–63k. These inwardly positioned vias are specifically positioned to cooperate with strip line trace sections 40b and 42b to provide two shielded strip lines.

In a specific embodiment the vias are laterally spaced at 0.040 inches on centers. The front and back lines of vias are spaced inwardly of the front and back outmost edges of the substrate by 0.060 inches. The corner vias (48a, 48f, 48g, 48l, 63a, 63f, 63g, 63l) of the generally rectangular via array are displaced inwardly, away from the center lines of the strip line trace sections, by 0.073 inches. These vias, together with the metal lid and base define a resonant electrical cavity encompassing the chip and that helps to avoid resonance in the $K_2$-band frequency range of about 26–36 GHz.

Figure 4:
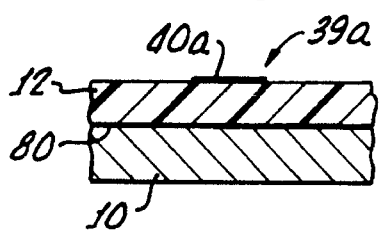
FIGS. 4, 5 and 6 are sectional views taken on lines 4—4, 5—5, and 6—6 of FIG. 3.
Figure 5:
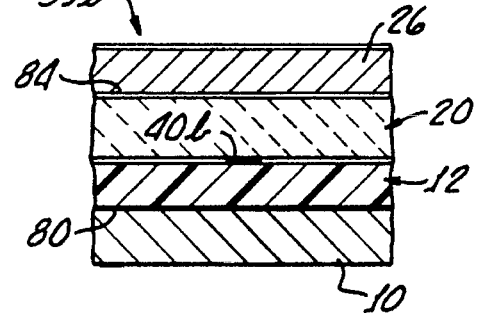
Figure 6:
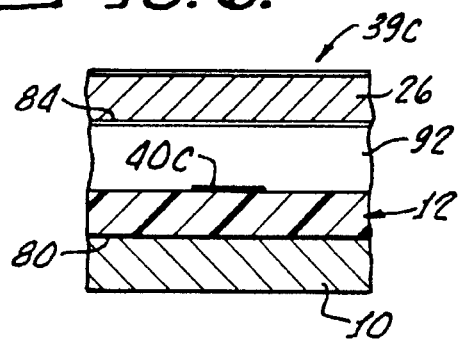

FIGS. 4, 5 and 6 show the outer, intermediate, and inner sections of each of the left and right input/output (I/O) transmission lines, generally designated as 40,42. The left side transmission line includes an outer section 39a forming a microstrip line, an intermediate section 39b (covered by wall rail 62) and forming a shielded strip line section, and an inner section 39c extending between the wall rail 62 and the edge of substrate recess 14. This transmission line inner section 39c forms part of a capacitor.

FIG. 4 is a section taken on line 4—4 of FIG. 3 (with the lid omitted), showing the microstrip line section 39a of the left side I/O transmission line. This includes a lower conductor section 80, which is actually formed by the electrically conductive base 10, the interposed substrate 12, and the trace section 40a. These three elements, together with the conductive trace section 40a, the conductive base 80 and the interposed dielectric 12, form the microstrip transmission line section 39a at the outermost portion of the left I/O line of the assembly.

As can be seen in FIG. 5, the shielded strip line transmission line section 39b of the I/O line again includes a lower conductive element formed by base portion 80 and the interposed substrate 12. The shielded strip line section also includes intermediate trace section 40b, the two adjacent vias 48a, 48l (FIG. 3), a second interposed dielectric portion 20 formed by wall rail 62, and a portion 84 formed by the lower side of the metallic electrically conductive kovar lid 26. This shielded strip line section of the I/O is completely covered by the left wall rail 62 and shielded in part by conductive vias 48a, 48l.

The innermost transmission line section 39c of the left I/O transmission line forms a capacitor of a particular size and configuration. This section 39c forms the capacitor that is connected to the die by means of the wire bond 21, and directly to the shielded strip line section 39b and thence to the microstrip line section 39a. It will be understood, of course, that circuitry outside of the package assembly is connected to the outer end of the microstrip line and to the outermost ends of conductive traces 36a through 36j.

As can be seen in FIG. 6 capacitor 39c is formed by the upper side 80 of base structure 10, the interposed dielectric substrate 12 and the innermost portion 40c of the trace that is deposited on the substrate, including nickel and gold deposited after the wall 12 has been bonded to the substrate. Above the trace portion 40c, as seen in FIG. 6, is a space or air portion 92, and then the lowermost metallic portion of metallic lid 84. Neither the lid 84 nor the air space 92 forms part of the capacitor.

Capacitor trace part 40c is deposited on the substrate 12 with a specific width and length that cooperates with the base portion 80 and dielectric between the trace 40c and the base to form a capacitor 39c of predetermined electrical capacitance. The capacitor dimensions are chosen to provide a capacitance adapted to compensate for the inductance induced by the wire bond connection. Therefore the input impedance of the entire transmission line can be maintained at an acceptable level throughout the concerned $K_a$-band frequencies.

In a particular example, the capacitor trace section 40c has a width of 0.0146±0.001 inches and a length of 0.012 inches with a tapered transition to the narrower shielded strip line trace section. The width and the very short length of capacitor trace section 40c provide a capacitance for capacitor 39c that will compensate for the inductance induced by the 10 mil long×0.0007" diameter, gold wire connecting the capacitor trace 40c to the bond pad 21 of MMIC die 16. Therefore the 50 ohm impedance at the $K_a$-band frequencies can be maintained. The shielded strip line section 39b itself has a length of 0.022 inches and a width of 0.0056±0.001 inches. Microstrip line section 39a of the I/O transmission line has a length of 0.026 inches to the point at which it starts to taper to the narrower shielded strip line section 39b and has a width substantially equal to the width of the capacitor, namely 0.0146±0.001 inches. The length of capacitor section 39c is much less than the length of microstrip line section 39a.

In this embodiment the right one of the input/output lines, line 42, is identical to the left one, line 40, of the input/output lines, although of opposite hand. The two are symmetrical in location and identical in size. However, for use with a specific die, in which I/O pads are asymmetrically positioned from front to back, the I/O lines 40,42 will be correspondingly positioned so that the I/O lines may be lined up with the bond pads 21 and 23 (FIG. 2) of the specific die. However, the vias 48a, 63a, and 48l, 63l are symmetrically positioned to the center line of the line 40 by 0.073" for the corresponding width 0.0056"±0.001" of strip line 40b. The same theory applies to the line 42 and vias 48f, 63f, 48g, 63g. The lines of vias themselves are sequentially positioned, front to back, and side to side, relative to the base and wall outer boundaries and relative to the base and wall openings.

The package described above provides RF transmission lines into and out of the package, each transmission line consisting of a micro-strip transmission line section, a shielded strip line transmission line section and a capacitor section all integrally formed with one another and integrated together with the package. The shielded strip line section as illustrated in FIG. 5 is formed of portions of the dielectric wall 20 and substrate 12 with the interposed trace portion 40b together with, for the left side of the package as viewed in FIG. 3, the two vias 48a and 48l that are positioned on opposite sides of the shielded strip line section. These vias each have a diameter of 0.008 inches and are positioned 0.146 inches apart, being filled with tungsten physically and electrically connect the metallization of the upper surface of dielectric wall 20 and the metallization of the lower side of the lower dielectric substrate 12. The capacitor portion of the RF transmission line, as can be seen in FIG. 6, is formed of the trace portion 40c and a portion of the substrate dielectric 12. The dielectric 12 has a thickness of 0.015 inches, a dielectric constant of 9.5. The capacitor trace portion has a length of 0.012 inches and a width of 0.0146 inches. This produces a capacitance which compensates for inductance that is induced by the wire bond which connects the input or output port of the chip to the RF I/O port of the package.

There has been described an improved $K_2$-band MMIC package formed of materials that are readily and inexpensively processed and simple, but effectively sealable to provide a good hermetically sealed enclosure. Importantly, I/O transmission lines include a precisely formed and dimensioned capacitor that reduces insertion losses and a fully shielded strip line section between the wall and substrate. An array of vias help to define an electrical cavity that can be operated within 26–36 GHz without resonances.

What is claimed is:

1. A high frequency integrated circuit chip package comprising:

an electrically conductive base, a dielectric substrate having an opening therein and bonded to said base, a package wall section bonded to said substrate and circumscribing said opening wherein said wall section includes a rail, a lid adapted to be bonded to said package wall section, a plurality of conductive traces formed on said dielectric substrate and positioned between a portion of said substrate and said wall section, at least some of said traces forming an input/output transmission line having a series connected microstrip line trace section, a shielded strip line trace section, and a capacitor trace section wherein an intermediate line section of said input/output transmission line is covered by said rail of said wall section and inner and outer line sections of said input/output transmission line are exposed, a plurality of vias extending through said wall section and substrate between said lid and base, and an electrically conductive filling in said vias.

2. The high frequency chip package of claim 1 wherein a capacitor is defined by and between said base and said capacitor trace section.

3. The high frequency chip package of claim 2 wherein said capacitor trace section, said microstrip line trace section, and said shielded strip line trace section are all formed at least in part by a single continuous trace deposited on said substrate, and wherein said capacitor trace section that defines said capacitor has a length that is less than the width of said microstrip line trace section.

4. The high frequency chip package of claim 3 wherein said capacitor trace section comprises a connection to a wire bond that is connected to a chip in said package.

5. The high frequency chip package of claim 1 wherein said substrate section and said wall section each comprises a ceramic material and wherein said wall section is heat bonded to said substrate.

6. The high frequency chip package of claim 1 wherein said wall section and substrate are formed of a ceramic material and including a plurality of vias extending through said wall section and substrate between said lid and base, and an electrically conductive filling in said vias.

7. The high frequency chip package of claim 1 wherein said wall section comprises an aluminum oxide wall having an outer surface thereof coated with successive layers of tungsten, nickel and gold.

8. The high frequency chip package of claim 1 wherein at least one of said input/output transmissions lines comprises an RF transmission line having an RF micro-strip portion, a RF shielded strip line portion, and an RF capacitor portion, and wherein said RF microstrip portion is defined by (a) said microstrip trace section formed on said substrate, (b) a portion of said base and (c) a portion of said substrate interposed between the base and said microstrip trace section, and wherein said RF shielded strip line portion is formed by (a) an intermediate section of said shielded strip line trace section formed on said substrate, (b) a portion of said base and a portion of said substrate interposed between said shielded strip line trace section and said base, (c) a shield portion of said package wall interposed between said shielded strip line trace section and a portion of said lid, and (d) a pair of conductive vias on opposite sides of said shielded strip line trace section interconnecting an upper side of said package wall section and said base.

9. The high frequency integrated circuit chip package of claim 1 wherein said shielded strip line trace section forms part of a shielded strip line RF transmission line section having a width of 0.0056 inches and a length of 0.022 inches and includes flared ends, and shielded strip line RF transmission line section including first and second electrically conductive vias on opposite sides of said shielded strip line section each electrically connecting the package lid and the electrically conductive base.

10. The high frequency integrated circuit chip package of claim 1 including at least one RF transmission line comprised of a micro-strip transmission line section, a strip line transmission line section, and a capacitor transmission line section integrated with each other and with the circuit chip package, said strip line transmission line section comprising an upper dielectric layer forming a portion of said package wall section and a lower dielectric layer forming a portion of said substrate, said upper and lower dielectric layer each having a length of 0.030 inches and the thickness of 0.015 inches, said shielded strip line section conductive trace having a length of 0.022 inches and a width of 0.0056 inches and including flared tail ends, and including first and second vias filled with electrically conductive material positioned on opposite side of said strip line transmission line section and electrically connecting an upper metallized surface of said wall section and a lower metallized surface of said substrate section.

11. The high frequency integrated circuit chip package of claim 1 wherein at least one of said input/output transmission lines includes an RF micro-strip portion, an RF shielded strip line portion and an RF capacitor portion, all integrated with each and with the package, said RF capacitor portion including a capacitor part of said substrate having a thickness of 0.015 inches, a width of 0.0146 inches and a length of 0.012 inches, said capacitor portion of said dielectric substrate having a metallization layer on its lower surface, said capacitor portion of the transmission line including said capacitor trace section of said conductive trace, said capacitor trace section of said conductive trace having a length of 0.012 inches and a width of 0.0146 inches, said package being adapted to mount an integrated circuit chip within the recess of the said substrate wherein said chip is wire bonded to said capacitor trace section, said RF capacitor portion of said transmission line providing capacitance that compensates for inductance induced by the wire bond connection between an integrated circuit chip mounted within the recess of the said substrate and said conductive trace section.

12. The high frequency chip package of claim 1 wherein said intermediate line section comprises a layer of tungsten, and said inner and outer line sections each comprises successive layers of tungsten, nickel and gold.

13. The high frequency chip package of claim 12 wherein said inner line section has a length that is less than the width of said outer line section and wherein said inner line section cooperates with an adjacent portion of said base and an interposed portion of said substrate to define a high frequency capacitor that controls impedance of said input/output transmission line.

14. The high frequency chip package of claim 1 further comprising an integrated circuit chip mounted in said opening in said dielectric substrate and having connecting pads connected to said input/output transmission lines.

15. The package of claim 14 wherein said wall section and substrate each is formed of a ceramic material heat bonded to one another, and wherein said base is brazed to said substrate and said lid is brazed to said wall section.

16. The package of claim 14 wherein said substrate and wall sections comprise a pair of high temperature co-fired ceramic layers.

17. A high frequency integrated circuit chip package comprising:

a ceramic wall having a dielectric constant of 9.5 and a thickness of 0.015 inches, a ceramic substrate having a dielectric constant of 9.5, a thickness of 0.015 inches and bonded to said ceramic wall, said ceramic wall and said ceramic substrate each having mutually aligned openings for chip-mount and wire bond, said ceramic wall having an upper metallized surface and said ceramic substrate having a lower metallized surface, a plurality of vias located in a rectangular circumference having a width of 0.160 inches and a length of 0.200 inches, each said via extending through said wall and substrate in a pattern that circumscribes said ceramic wall and ceramic substrate opening, and each of said vias being filled with a metallized conductive material that forms a conductive path between the upper metallized surface of the ceramic wall and the lower metallized surface of the ceramic substrate, and a metal base brazed to the metallized lower surface of the ceramic substrate, thereby defining an open cavity for mounting a integrated circuit chip.

18. The integrated circuit chip package of claim 17 including an integrated circuit chip in said cavity upon said ceramic substrate, said ceramic substrate having a plurality of conductive traces formed thereon and said integrated circuit chip being wire bonded to said circuit traces, and a metallic package lid soldered to the upper metallized surface of the ceramic wall thereby providing a hermetically sealed package.

19. The package of claim 14 wherein said capacitor trace section of said input/output transmission line has a length considerably less than the width of said microstrip line trace section of said input/output transmission line.

* * * * *